(12) United States Patent
Park

(10) Patent No.: US 7,319,241 B2
(45) Date of Patent: Jan. 15, 2008

(54) SURFACE EMITTING DEVICE, MANUFACTURING METHOD THEREOF AND PROJECTION DISPLAY DEVICE USING THE SAME

(75) Inventor: Chan Young Park, Seoul (KR)

(73) Assignee: LG Electronics Inc., Seoul (KR)

( * ) Notice: Subject to any disclaimer, the term of this patent is extended or adjusted under 35 U.S.C. 154(b) by 95 days.

(21) Appl. No.: 11/004,757

(22) Filed: Dec. 3, 2004

(65) Prior Publication Data
US 2005/0121662 A1 Jun. 9, 2005

(30) Foreign Application Priority Data
Dec. 4, 2003 (KR) ............... 10-2003-0087664

(51) Int. Cl.
*H01L 29/18* (2006.01)
(52) U.S. Cl. ........................ 257/88; 257/98
(58) Field of Classification Search .......... 257/88, 257/89, 98, 99, E25.021
See application file for complete search history.

(56) References Cited

U.S. PATENT DOCUMENTS

| | | | |
|---|---|---|---|
| 7,064,354 B2 * | 6/2006 | Chen | 257/89 |
| 7,095,052 B2 * | 8/2006 | Lester | 257/79 |
| 7,119,487 B2 * | 10/2006 | Ikeda | 313/498 |
| 2005/0083696 A1 * | 4/2005 | Chiang et al. | 362/268 |

* cited by examiner

*Primary Examiner*—Mark V. Prenty
(74) *Attorney, Agent, or Firm*—Lee, Hong, Degerman, Kang & Schmadeka

(57) ABSTRACT

There are provided a surface emitting device and a projection display device, in which high power output can be produced by configuring a large-scaled LED. The surface emitting device includes a plurality of stacked light emitting elements provided on one module. Each of the stacked light emitting elements includes n-type layers, light emitting layers and p-type layers, which are formed in sequence.

16 Claims, 5 Drawing Sheets

SURFACE EMITTING DEVICE, MANUFACTURING METHOD THEREOF AND PROJECTION DISPLAY DEVICE USING THE SAME

This application claims the benefit of the Korean Application No. 10-2003-0087664 filed on Dec. 4, 2003, which is hereby incorporated by reference.

BACKGROUND OF THE INVENTION

1. Field of the Invention

The present invention relates to a surface emitting device and a projection display device using the same, and more particularly, to a surface emitting device and a projection display device, in which high power output can be produced by configuring a large-scaled LED.

2. Discussion of the Related Art

A light emitting diode (LED) is a device that emits light using an electric signal. The LED can be driven at a low voltage such that it is widely in small-sized optical elements. In recent years, the LED is developed as an illuminating light source by increasing its efficiency.

FIG. 1 is a view showing a structure of a conventional LED.

Referring to FIG. 1, a conventional LED includes an n-type layer 12, a light emitting layer 13 and a p-type layer 14, which are sequentially stacked on a substrate 11.

The p-type layer 14 is connected to an anode electrode 15 such that positive voltage is supplied thereto, and the substrate 11 is connected to a cathode electrode 16 such that negative voltage is supplied thereto.

If voltages are applied to the anode electrode 15 and the cathode electrode 16, electrons are moved due to a voltage difference between the anode electrode 15 and the cathode electrode 16. Thus, energy change occurs within the light emitting layer 13 and light is emitted. The light emitted from the light emitting layer 13 is dispersed in all directions. In order to focus the light in one direction, a reflector 7 is provided to reflect the light. The reflected light is condensed by a condenser lens 18.

In such an LED, a single chip or a single module may be used as a light source. However, since the luminous efficiency of the LED is limited, it is difficult to use the single chip or the single module as a high-power light source.

Meanwhile, as shown in FIGS. 2A and 2B, a plurality of LED modules 21 must be arranged in vertical and horizontal directions so as to use the LED as a light source for surface emission.

Since the LED chip has a very small size (several tens of micrometers), a large number of LED chips are required in configuring a surface light source of a predetermined size. Thus, when the LED chip is driven, power consumption is increased.

In addition, it is difficult to make the reflector and the condenser lens with small sizes, gaps 22 in the LED arrangement are wide. Thus, circuit interconnections for connecting the LEDs are complicated. For these reasons, there occur problems in using the LED as the surface light source.

Further, the single LED module has a limit in the power output, and the surface light source configured with the arrangement of the LED modules has many problems. Therefore, it is difficult to adopt the LED as the light source for the illuminating system or the projection display device.

SUMMARY OF THE INVENTION

Accordingly, the present invention is directed to a surface emitting device, a manufacturing method thereof and a projection display device using the same that substantially obviates one or more problems due to limitations and disadvantages of the related art.

An object of the present invention is to provide a surface emitting device and a projection display device using the same, in which high power is produced at the same area.

Another object of the present invention is to provide a surface emitting device that can implement a single surface light source by configuring a large-scaled LED.

Another object of the present invention is to reduce the configuration and size of an optical system, such as an illuminating system or a projection display device, to which a surface light source is applied.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a surface emitting device includes a plurality of stacked light emitting elements provided on one module, wherein each of the stacked light emitting elements includes n-type layers, light emitting layers and p-type layers, which are formed in sequence.

The stacked light emitting elements may be arranged in a vertical and/or horizontal direction.

The stacked light emitting elements may be stacked in a vertical direction.

The stacked light emitting elements may be at least one of an LED chip, an organic EL (electro luminescence), an inorganic EL, a laser diode, and a semiconductor light emitting element.

The surface emitting device may further include: a substrate attached on the stacked light emitting elements; a transparent electrode attached below the stacked light emitting elements; a reflective layer attached below the transparent electrode; and a reflector configured to reflect the light generated from the stacked light emitting elements in one direction.

The p-type layers may be connected together and the n-type layers are connected together.

In another aspect of the present invention, a projection display device includes: the surface emitting device having the above-described structure; an LCD panel for receiving a light from the surface emitting device and display corresponding color images in response to an electric signal; a prism for combining the images displayed on the LCD panel; and a projection system for enlarging and projecting the combined images on a screen.

The surface emitting device may be at least one of red, green and blue surface light sources.

In a further another aspect of the present invention, a method for manufacturing a surface emitting device includes the steps of: a) sequentially stacking a first p-type layer, a first light emitting layer and a first n-type layer on a substrate; b) sequentially stacking a second p-type layer, a second light emitting layer and a second n-type layer on the first n-type layer; c) performing the step b) at least one time;

d) attaching the stacked light emitting element configured through the steps a) to c) to a transparent electrode on which an anode electrode pattern and a cathode electrode pattern are formed; e) attaching a reflective layer below the transparent electrode, the reflective layer being coated with metal; and f) radiating lights emitted from the plurality of light emitting layers within a specific angle by using a reflector.

The method may further include the step of electrically connecting the p-type layers together and electrically connecting the n-type layers together.

The p-type layers and the n-type layers may be electrically connected through sides of the stacked light emitting elements.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
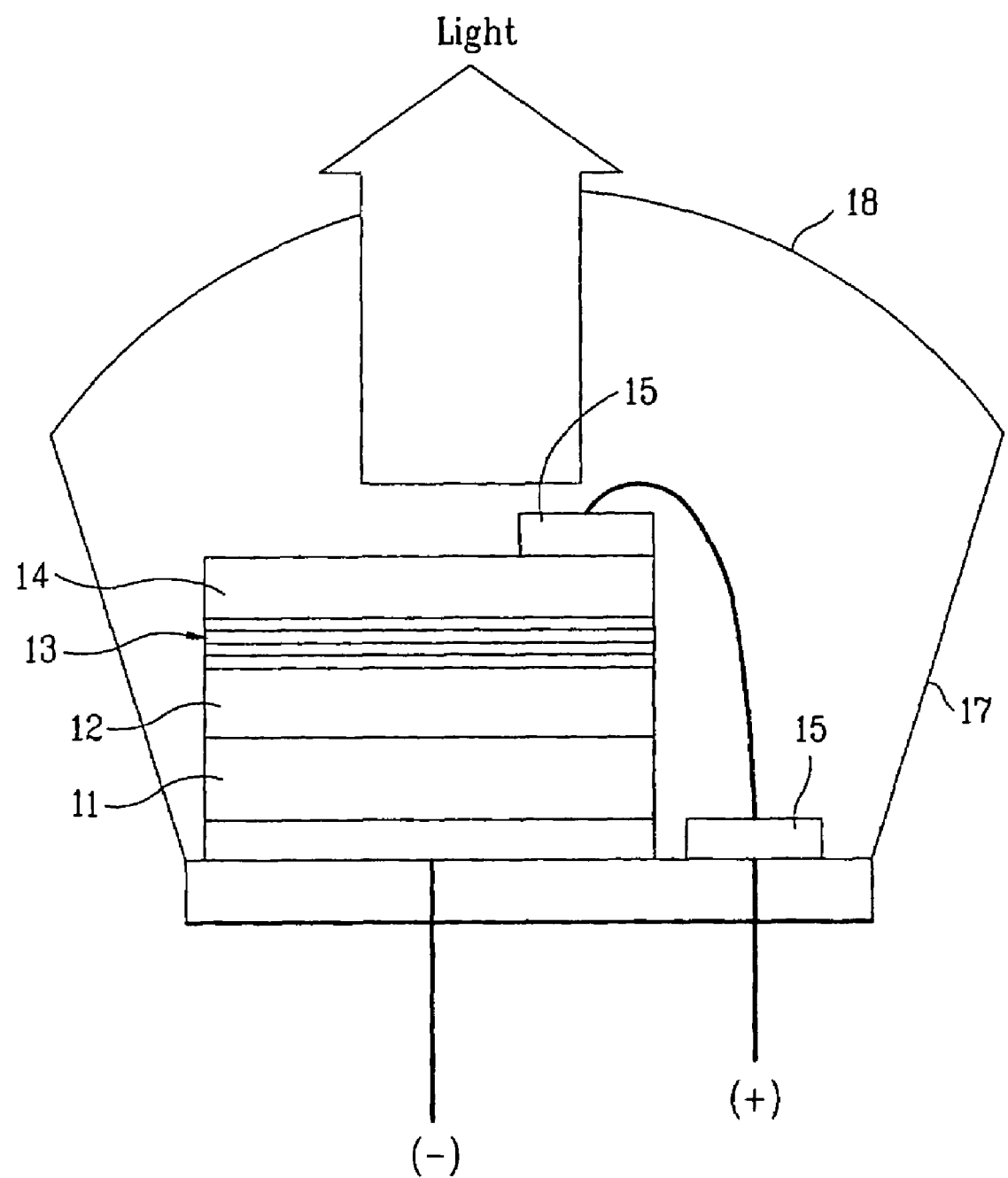
FIG. 1 illustrates a structure of a conventional LED.
Figure 2A:
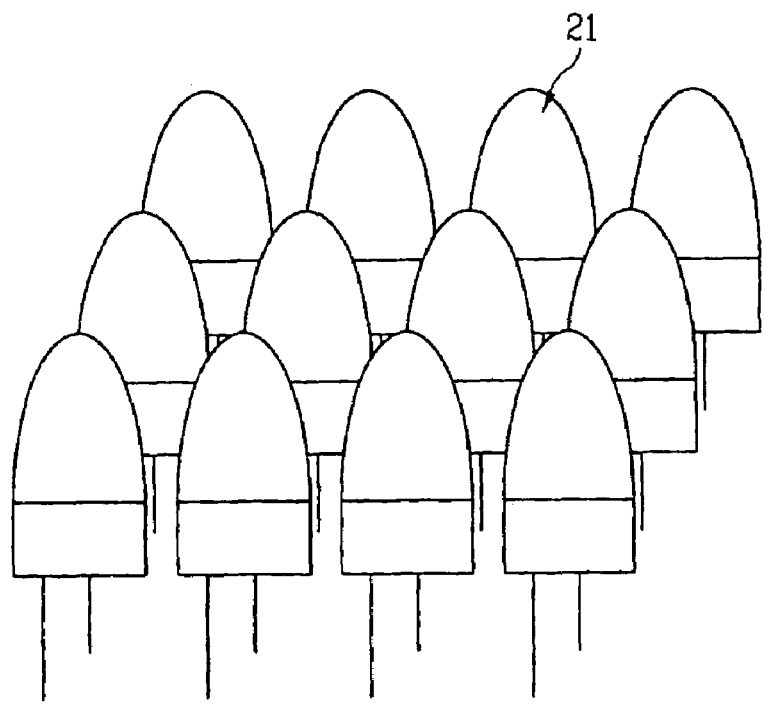
FIGS. 2A and 2B illustrate an example of a surface emitting device using a conventional LED module.
Figure 2B:
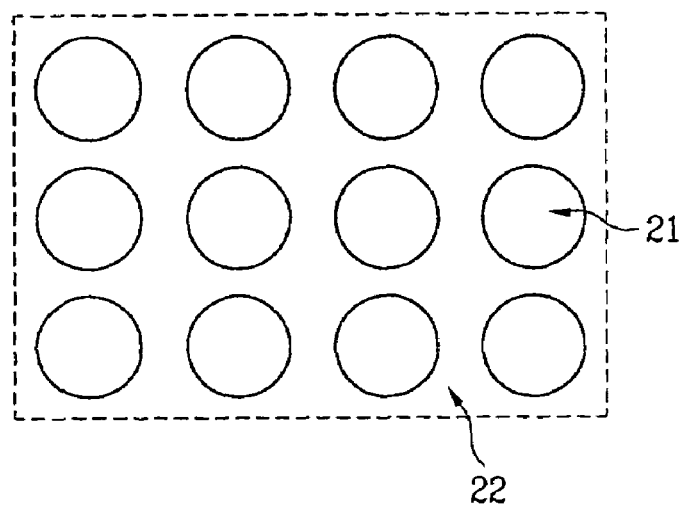
Figure 3:
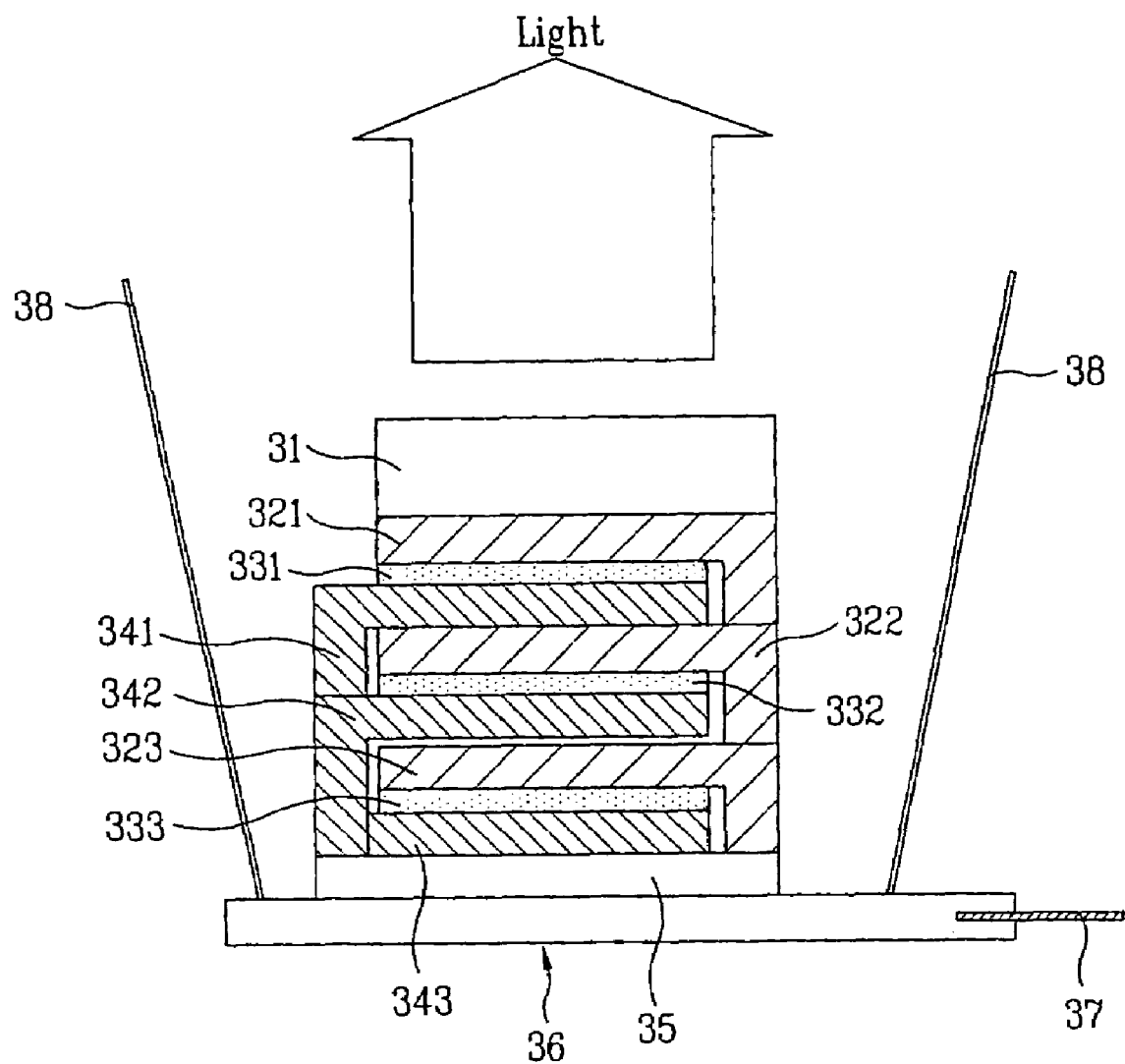
FIG. 3 illustrates a surface emitting device according to the present invention.

FIG. 3 illustrates a structure of a surface emitting device according to the present invention.

Referring to FIG. 3, the surface emitting device includes a plurality of LED chips stacked in a vertical direction, a transparent electrode 35 having an anode pattern and a cathode pattern, a reflective layer 36 for reflecting light emitted from the LED chips, an electric signal for enabling the LED chips to emit light, and a reflector 38 for focusing the emitted light at the specific angle. Each of the LED chips includes an LED substrate 31, p-type electrodes 321, 322 and 323, light emitting layers 331, 332 and 333, and n-type electrodes 341, 342 and 343.

The p-type electrodes are connected together through sides of the stacked LED chips and are connected to the anode electrode pattern of the transparent electrode 35. Meanwhile, the n-type electrodes are connected together through the sides of the stacked LED chips and are connected to the cathode electrode pattern of the transparent electrode 35.

An operation principle of the surface emitting device will now be described.

Referring to FIG. 3, the surface emitting device according to the present invention includes the plurality of LED chips, which have the same area and are arranged in a vertical direction.

That is, the p-type layer 321, the light emitting layer 331 and the n-type layer 341 of the first LED chip are sequentially stacked on the LED substrate 31. The LED substrate 31 is made of a transparent material that can allow the light transmission.

Then, the p-type layer 322, the light emitting layer 332 and the n-type layer 342 of the second LED chip are sequentially stacked on the n-type layer 341 of the first LED. Also, the p-type layer 323 and the n-type layer 343 of the third LED chip are stacked on the n-type layer 342 of the second LED chip.

Although three LED chips are stacked, four or more LED chips can also be stacked in the above manner. That is, at least two or more LED chips can be stacked in the above manner.

If the last LED chip is configured, the LED chips stacked on the LED substrate 31 are attached on the transparent electrode 35. The anode electrode pattern (not shown) and the cathode electrode pattern (not shown) are formed on the transparent electrode 35 to supply the driving voltage to the respective LED chips.

The p-type layers are connected together through the sides of the stacked LED chips, and the n-type layers are connected together through the stacked LED chips. The p-type layers and the n-type layers are electrically connected to the anode electrode pattern and the cathode electrode pattern of the transparent electrode 35, respectively.

The reflective layer 36 coated with metal is attached below the transparent electrode 35.

If the electric signal 37 is applied to the reflective layer 36, voltage difference occurs in the p-type layer and the n-type layer of the stacked LED chips at the same time, thereby emitting the light.

The light emitted from the light emitting layer of each LED chip is combined within the structure of the stacked LED chips and then propagated.

That is, the emitted light is dispersed in all directions. Among the lights emitted from the light emitting layer 331 of the first LED chip, a light directed in the p-type layer 321 of the first LED chip passes through the transparent LED substrate 31. A light directed in the n-type layer 341 of the first LED chip passes through the LED chips and then is reflected at the reflective layer 36. Thus, the light is propagated in an opposite direction, such that it passes through the LED substrate 31. Based on the above principle, the lights emitted from the other LED chips are radiated in the direction of the LED substrate 31.

Meanwhile, the emitted light is reflected by the reflector 38 and is propagated within a specific angle. The angle can be adjusted depending on the shape of the reflector 38.

Consequently, high power can be obtained by stacking the LED chips in a vertical direction.

In this manner, the LED surface light source can be used as a light source for a display unit of the projection display device.

Figure 4:
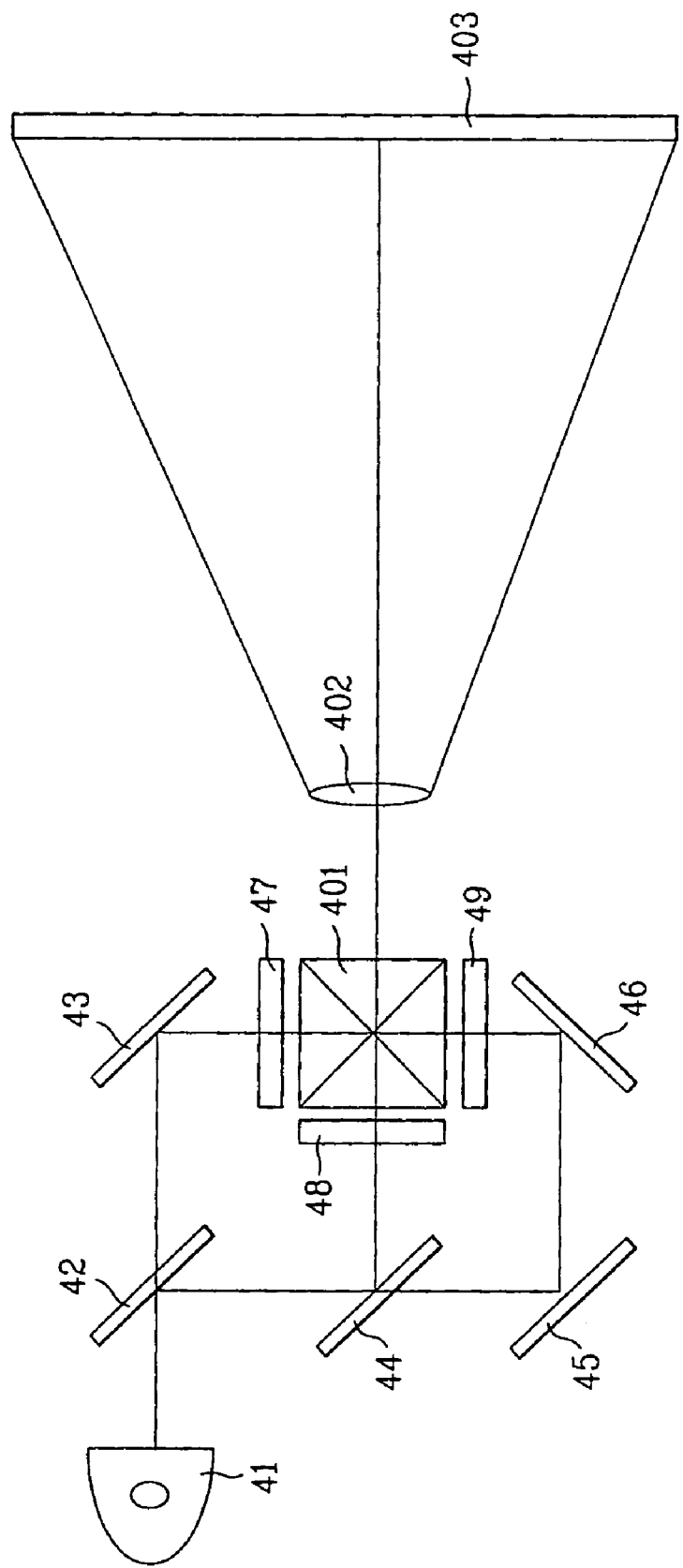
FIG. 4 illustrates a projection display device using a lamp as a light source according to the prior art.
Figure 5:
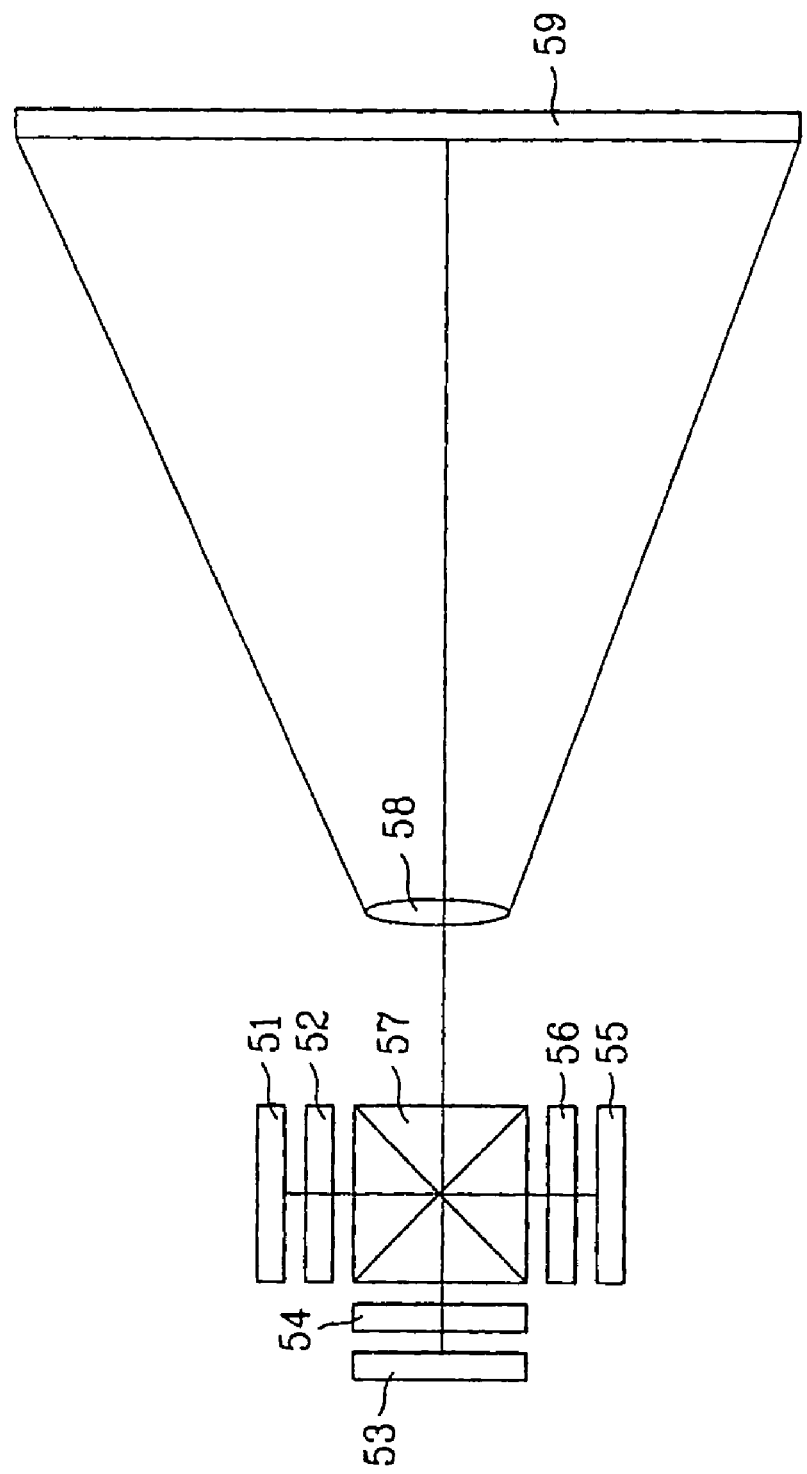
FIG. 5 illustrates a projection display device using a surface emitting device as a light source according to the present invention.

FIG. 4 illustrates a conventional projection display device that uses a lamp as a light source, and FIG. 5 illustrates a projection display device that uses an LED surface light source as a light source according to the present invention.

According to the prior art, the single LED module has a limit in the power output and the surface light source configured with the LED modules has many problems, such that it is difficult to apply the LED to the optical system. Therefore, a white light lamp is sued in the optical system. Such an optical system will be described below.

Referring to FIG. 4, the light emitted from the lamp 41 is focused in one direction by the reflector. A red filter 42 transmits a red light and reflects a green light and a blue light. The red light is reflected by a red mirror 43 and is radiated to a red LCD.

Meanwhile, the green and blue lights reflected from the red filter 42 are incident to a blue filter 44. The blue filter 44 transmits the blue light and reflects the green light. The reflected green light is radiated to a green LED 48, and the transmitted blue light is reflected by first and second mirrors 45 and 46 and then radiated to a blue LCD 49.

The red (R), green (G) and blue (B). LCDs 47, 48 and 49 display images corresponding to the respective colors in response to the electric signal, and the color images are combined by a prism 401. The combined color images are enlarged and projected on a screen 403 by a projection system 402, allowing a viewer to watch the projected images.

Unlike the conventional optical system using the white light lamp, the optical system using the R, G and B LED surface light sources can be implemented with the large-scaled high power LED.

Referring to FIG. 5, the R, G and B LED surface light sources 51, 53 and 55 radiate light just behind the R, G and B LCDs 52, 54 and 56. The R, G and B LCDs 52, 54 and 56 display images corresponding to the respective colors in response to the electric signal, and the color images are combined by a prism 57. The combined color images are enlarged and projected on a screen 59 by a projection system 58, allowing a viewer to watch the projected images.

Like this, because the LED surface light source radiates the light just behind the display unit, elements such as a lamp, a color filter for color separation and a mirror are unnecessary. Thus, a simple and small-sized optical system can be implemented.

The surface emitting device according to the present invention has following effects.

First, a plurality of LED chips are stacked in a vertical direction and the lights from the LED chips are focused in one direction, thereby providing a high-power light source.

Second, since a surface light source that emits light on one LED surface can be implemented, it is possible to solve problems (high power consumption, ununiform optical distribution, degradation of efficiency due to the reflector and the condenser lens, complexity in circuit interconnections, etc.), which are incurred when the surface light source is configured with a plurality of LED modules.

Third, the optical system can be simplified and reduced in sized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A surface emitting device comprising a plurality of stacked light emitting elements provided on one module, each of the stacked light emitting elements comprising an n-type layer, a light emitting layer and a p-type layer, which are formed in sequence,
wherein the p-type layers of the plurality of stacked light emitting elements are connected together and the n-type layers of the plurality of stacked light emitting elements are connected together.

2. The surface emitting device of claim 1, wherein the stacked light emitting elements are arranged in a vertical and/or horizontal direction.

3. The surface emitting device of claim 1, wherein the stacked light emitting elements are stacked in a vertical direction.

4. The surface emitting device of claim 1, wherein the stacked light emitting elements are at least one of an LED chip, an organic EL (electro luminescence), an inorganic EL, a laser diode, and a semiconductor light emitting element.

5. The surface emitting device of claim 1, further comprising:
a substrate attached on the stacked light emitting elements;
a transparent electrode attached below the stacked light emitting elements;
a reflective layer attached below the transparent electrode; and
a reflector configured to reflect the light generated from the stacked light emitting elements in one direction.

6. The surface emitting device of claim 5, the substrate is made of a transparent material.

7. The surface emitting device of claim 5, further comprising an anode electrode pattern and a cathode electrode pattern, which apply a driving voltage to the p-type layer and the n-type layer, respectively.

8. The surface emitting device of claim 7, wherein the p-type layer is electrically connected to the anode electrode pattern and the n-type layer is electrically connected to the cathode electrode pattern.

9. The surface emitting device of claim 5, wherein the reflective layer is coated with metal.

10. The surface emitting device of claim 5, wherein an electric signal is applied to the reflective layer.

11. A projection display device comprising:
the surface emitting device having the structure of claim 1;
an LCD panel for receiving a light from the surface emitting device and display corresponding color images in response to an electric signal;
a prism for combining the images displayed on the LCD panel; and
a projection system for enlarging and projecting the combined images on a screen.

12. The projection display device of claim 11, wherein the number of the surface emitting device is plural.

13. The projection display device of claim 12, wherein the surface emitting device is at least one of red, green and blue surface light sources.

14. A surface emitting device comprising a plurality of stacked light emitting elements provided on one module, each of the stacked light emitting elements comprising an n-type layer, a light emitting layer and a p-type layer, which are formed in sequence,
wherein the light emitting layers emit light of the same color, the p-type layer is electrically connected to an anode electrode pattern and the n-type layer is electrically connected to a cathode electrode pattern, and the anode electrode pattern and the cathode electrode pattern are placed in the same plane.

15. A surface emitting device, comprising:
a plurality of stacked light emitting elements provided on one module, each of the stacked light emitting elements comprising an n-type layer, a light emitting layer and a p-type layer, which are formed in sequence;

a substrate attached on the stacked light emitting elements;

a transparent electrode attached below the stacked light emitting elements;

a reflective layer attached below the transparent electrode; and a reflector configured to reflect light generated from the stacked light emitting elements in one direction.

16. A projection display device, comprising:

a surface emitting device comprising a plurality of stacked light emitting elements provided on one module, each of the stacked light emitting elements comprising an n-type layer, a light emitting layer and a p-type layer, which are formed in sequence;

an LCD panel adapted to receive light from the surface emitting device and display corresponding color images in response to an electric signal;

a prism adapted to combine the images displayed on the LCD panel; and a projection system adapted to enlarge and project the combined images on a screen.

* * * * *